United States Patent
Hipwell, Jr. et al.

(10) Patent No.: US 6,733,681 B1
(45) Date of Patent: May 11, 2004

(54) LATERALLY SUPPORTED HANDLE WAFER FOR THROUGH-WAFER REACTIVE-ION ETCH MICROMACHINING

(75) Inventors: Roger L. Hipwell, Jr., Eden Prairie, MN (US); Lee Walter, Plymouth, MN (US); Wayne A. Bonin, North Oaks, MN (US); Barry D. Wissman, Eden Prairie, MN (US); Zine-Eddine Boutaghou, Vadnais Heights, MN (US); Barbara J. Ihlow-Mahrer, Crystal, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 546 days.

(21) Appl. No.: 09/707,698

(22) Filed: Nov. 7, 2000

Related U.S. Application Data

(60) Provisional application No. 60/193,558, filed on Mar. 31, 2000.

(51) Int. Cl.[7] ................................................. B81C 1/00
(52) U.S. Cl. ................................ 216/2; 216/11; 216/13; 216/67; 29/603.03; 257/678; 257/797; 438/106; 438/113
(58) Field of Search .................................. 216/2, 11, 13, 216/67; 257/678, 797; 29/603.03; 438/106, 113, 122

(56) References Cited

U.S. PATENT DOCUMENTS

| | | | |
|---|---|---|---|
| 5,085,727 A | 2/1992 | Steger | 156/345 |
| 5,501,893 A | 3/1996 | Laermer et al. | 428/161 |
| 5,710,057 A | 1/1998 | Kenney | 437/62 |
| 5,851,343 A | 12/1998 | Hsu et al. | 156/345 |
| 5,882,532 A | 3/1999 | Field et al. | 216/2 |
| 6,021,672 A | 2/2000 | Lee | 73/714 |
| 6,392,144 B1 * | 5/2002 | Filter et al. | 174/52.4 |

* cited by examiner

Primary Examiner—Allan Olsen
(74) Attorney, Agent, or Firm—Kinney & Lange, P.A.

(57) ABSTRACT

A method of handling a wafer for through-wafer plasma etching includes lateral support provided between a handle wafer and a product wafer without wafer bonding or an adhesive film using mating mechanical structures. The product wafer is easily separated from the handle wafer following etching without stripping or cleaning. Because the connection between the wafers is mechanical, not from an adhesive layer/bonded layer, a wafer can be etched, inspected, and subsequently continue to be etched without the hindrance of repeated bonding, separation, and cleaning. A non-bonded support for released devices following a through-etch process is also provided.

16 Claims, 11 Drawing Sheets

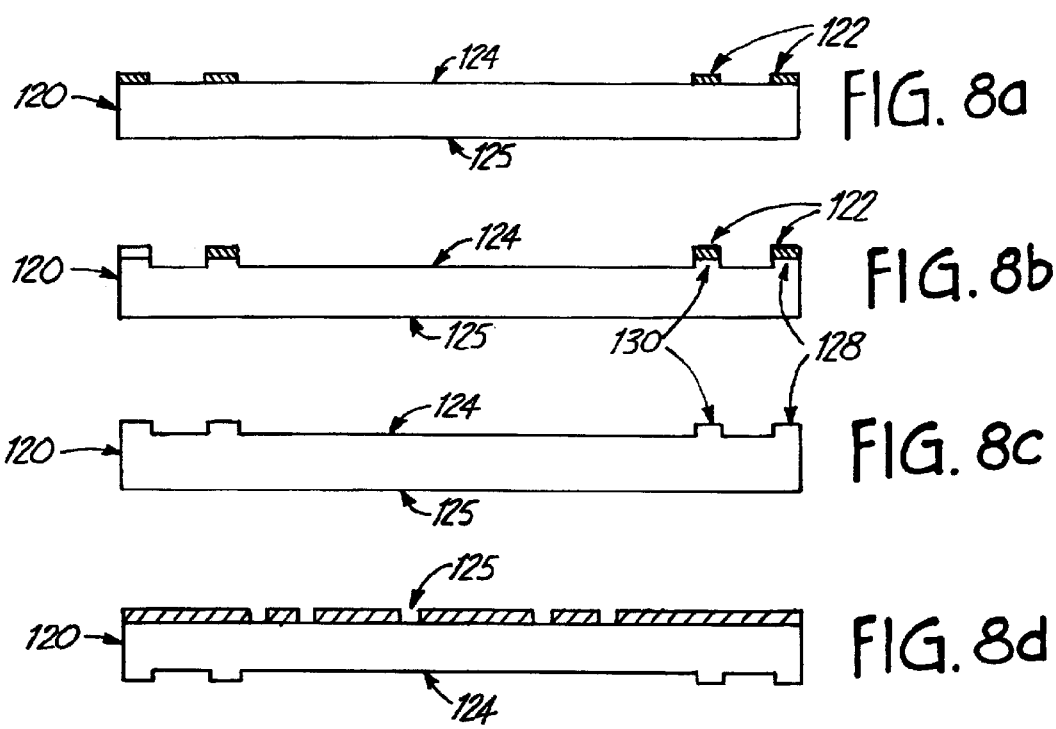

LATERALLY SUPPORTED HANDLE WAFER FOR THROUGH-WAFER REACTIVE-ION ETCH MICROMACHINING

CROSS-REFERENCE TO RELATED APPLICATION(S)

This application claims priority from Provisional Application No. 60/193,558 filed Mar. 31, 2000, for "Laterally Supported Handle Wafer For Through-Wafer RIE Micromachining" by R. Hipwell, L. Walter, W. Bonin, B. Wissman, Z. Boutaghou, and B. Ihlow-Mahrer.

BACKGROUND OF THE INVENTION

The present invention relates to handling of substrates that undergo a "through-etch" micromachining process, and more particularly to a method that provides a "handle" wafer with projecting support posts that interlock with complementary posts on the bottom side of a wafer to be through-etched (i.e., the product wafer).

In bulk silicon micromachining, a silicon wafer is etched to form mechanical beam elements in microelectromechanical systems (MEMS) devices such as microsensors and microactuators. This etching is often performed by an anisotropic plasma-etching process. In deep-trench reactive-ion etching (RIE), etches are often made through the entire wafer (forming trenches/holes from the front side of the wafer to the back side), defining a high-aspect ratio mechanical structure. However, two primary issues are faced when performing through-wafer etching.

First, a gas such as helium is often impinged on the back side of the wafer being etched to cool it during the etching process. However, as trenches are etched completely through the wafer, holes are created that allow helium to leak from the back side of the wafer to the front, etching side. This helium leakage causes undesirable localized and wafer-level effects in the etching due to variations in gas composition, plasma, and wafer cooling. Further, all such plasma etches have some inherent nonuniformity. Therefore, etching through the wafer results in parts releasing at different times. To etch through all devices on the wafer, a significant overetch (i.e., etching for an amount of time between when the first parts are released and the last parts are released) is required following the initial breakthrough. The primary problem associated with overetching is variations in feature dimensions that result from some areas being etched more than others, which causes marked changes in the dynamics of the different devices.

A second problem encountered with through-etching is when the etched silicon parts "release" from the wafer (i.e., any connections between a device and the wafer are etched away, thus separating the device from the wafer). This separation may be either intentional or unintentional. It is desired to have these released, singulated devices unloaded from the chamber along with the product wafer rather than letting pieces fall directly on the chamber cathode (which supports the product wafer during the through-etch process). In the latter case, the singulated devices are left behind in the chamber after wafer unloading, requiring further processing to retrieve the devices.

A common approach to these problems associated with through-etching is to attach an unpatterned "handle" wafer to the non-etch side of a product wafer using photoresist as a temporary adhesion layer. An example of such an approach appears in Field et al. U.S. Pat. No. 5,882,532. However, this presents many drawbacks such as photoresist residue left on the attached silicon surface, causing difficulties in releasing the etched wafer following the through-etch. Moreover, the photoresist in contact with the bottom side of the product wafer also changes the etching characteristics due to photoresist decomposition. This method can sometimes be used in a research environment, but is not a manufacturable solution for through-wafer etching of MEMS devices.

Another approach to through-etching involves silicon-on-insulator (SOI) wafers, in which product wafers are bonded to a handle wafer using an insulating bond layer such as silicon dioxide. The etch process proceeds down to the interlayer oxide, serving as an "etch-stop." Non-insulating films (such as a metal thin film) can also be used. However, both insulating and non-insulating films require a "release step" to remove the residual layer from the device following etching. This is often extremely undesirable or incompatible with MEMS processes. In addition, when an insulating layer such as silicon dioxide is used as an etch stop in narrow trenches during deep-trench RIE processes, an undesirable "footing effect," or lateral etching of RIE ions caused by charging in the oxide layer, is typically observed at the oxide/silicon interface.

BRIEF SUMMARY OF THE INVENTION

The present invention is a method of handling a wafer for through-wafer plasma etching. Lateral support is provided between a handle wafer and a product wafer without wafer bonding or an adhesive film (such as photoresist) using mechanically mating structures. The product wafer is easily separated from the handle wafer following etching without stripping or cleaning. Because the connection between the wafers is mechanical, rather than an adhesive/bonded layer, a wafer can be etched, inspected, and subsequently etched again without the hindrance of repeated bonding, separation, and cleaning. A non-bonded support for released devices following a through-etch process is also provided.

BRIEF DESCRIPTION OF THE DRAWINGS

FIG. 8a is a cross-section view showing a blank product wafer photopatterned with a photoresist mask in a selected mating structure pattern.

FIG. 8b is a cross-section view showing the product wafer of FIG. 8a after plasma etching those areas not protected by photoresist.

FIG. 8c is a cross-section view showing the product wafer of FIG. 8b after the photoresist has been removed.

FIG. 8d is a cross-section view showing the product wafer of FIG. 8c after inversion and application of photoresist defining high-aspect ratio elements to be through-wafer plasma etched.

DETAILED DESCRIPTION OF THE PREFERRED EMBODIMENTS

Figure 1:
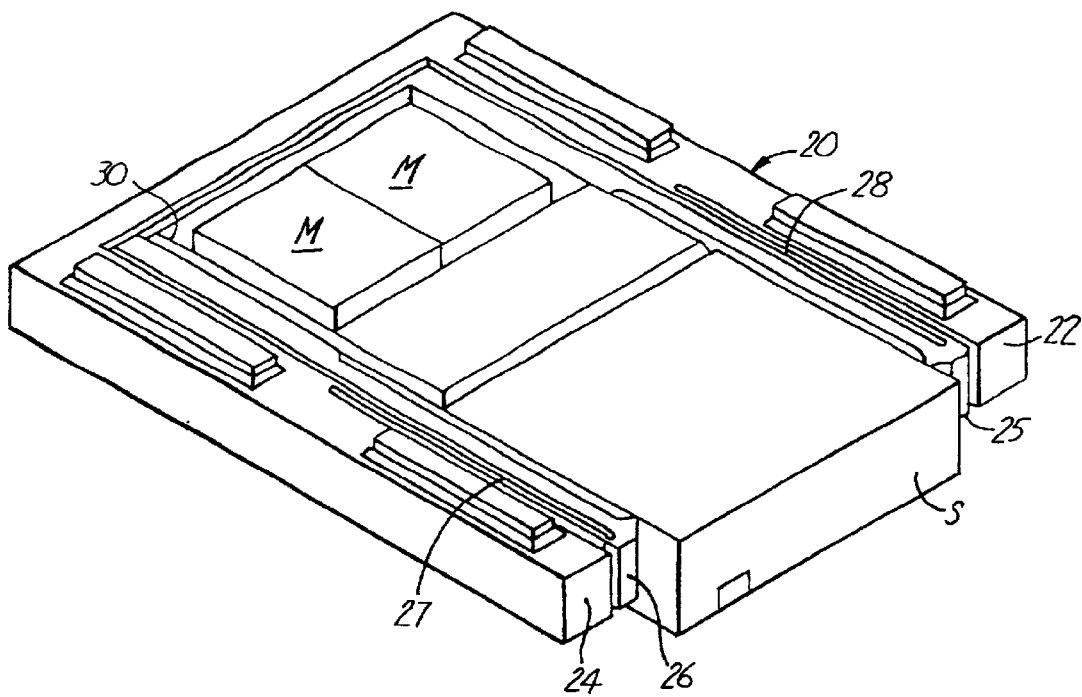
FIG. 1 is a perspective view of a MEMS microactuator system for positioning a slider over tracks of a disc.
Figure 2:
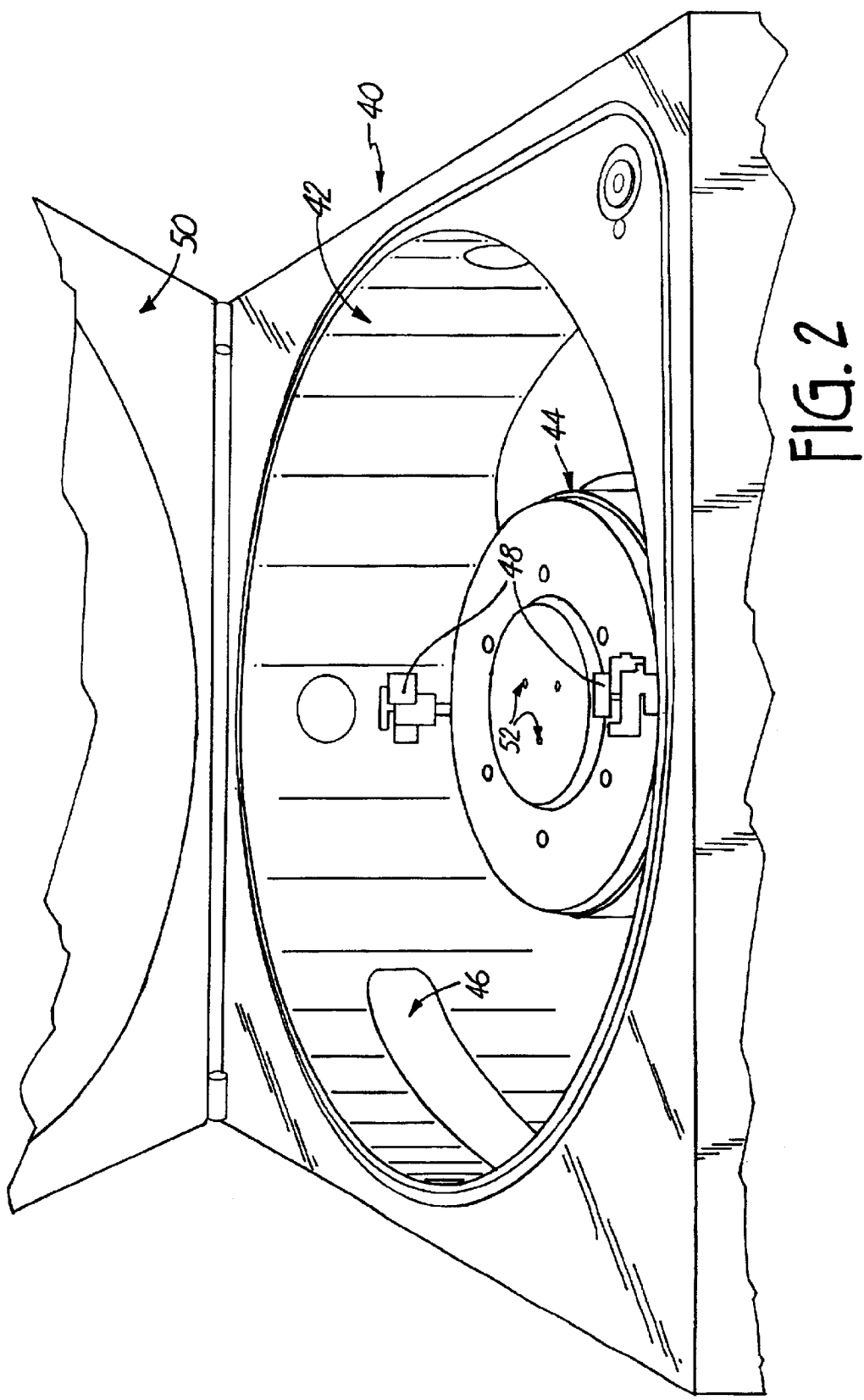
FIG. 2 is a perspective view of a typical plasma etch chamber with helium backside cooling.
Figure 3:
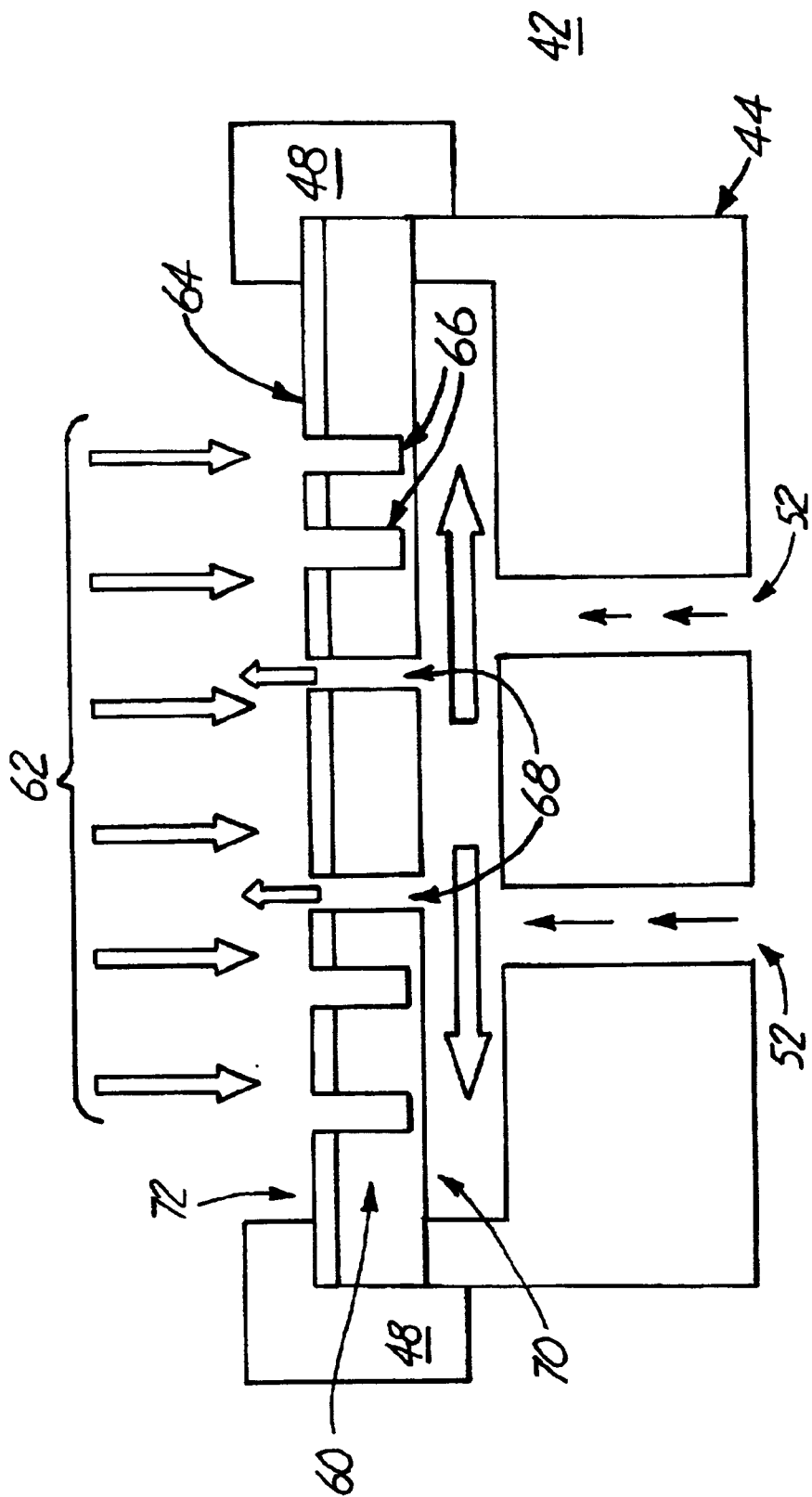
FIG. 3 is a cross-section view of a typical plasma etch chamber with helium backside cooling before through-wafer etch of a product wafer handled using a first prior art method.
Figure 4:
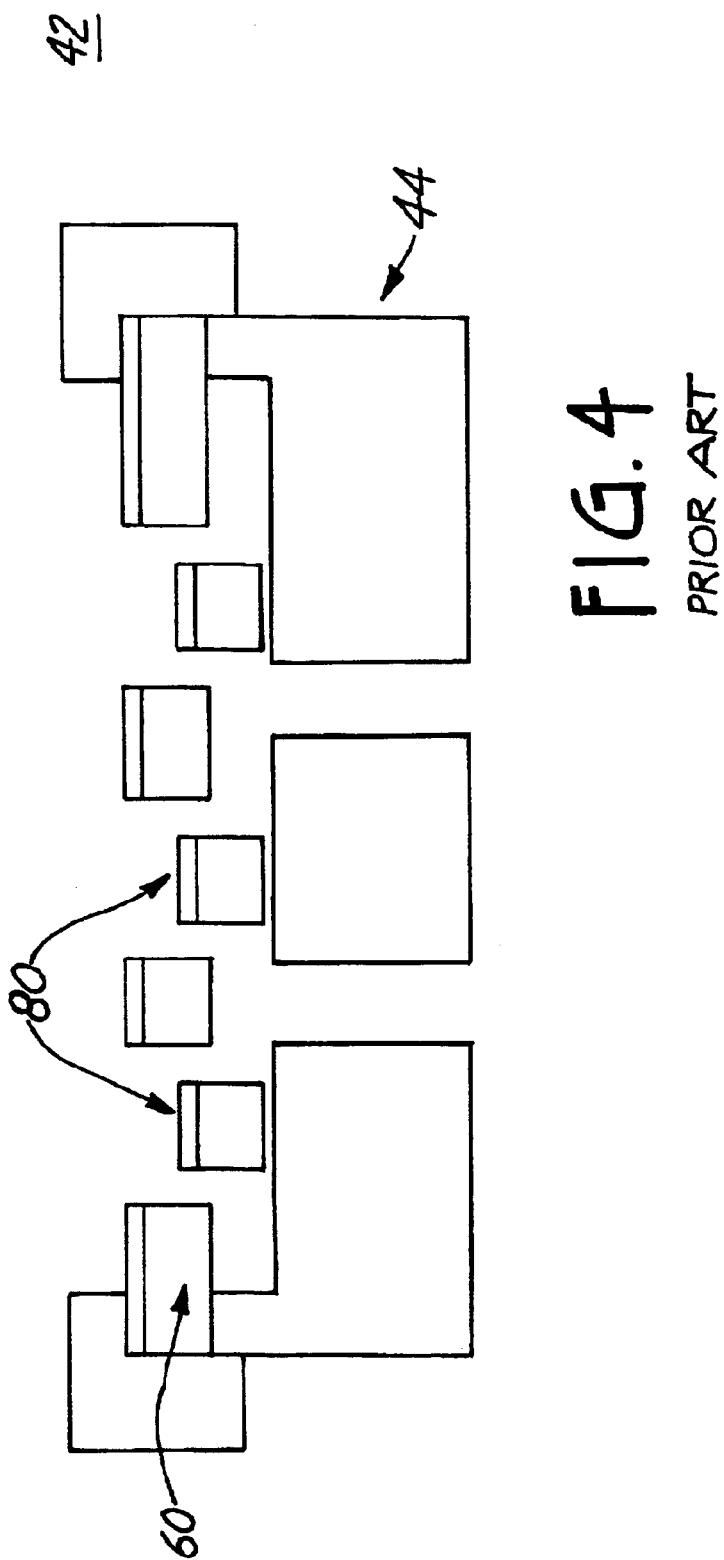
FIG. 4 is a cross-section view of a typical plasma etch chamber after completion of a through-wafer etch on a product wafer handled using a first prior art method.
Figure 5:
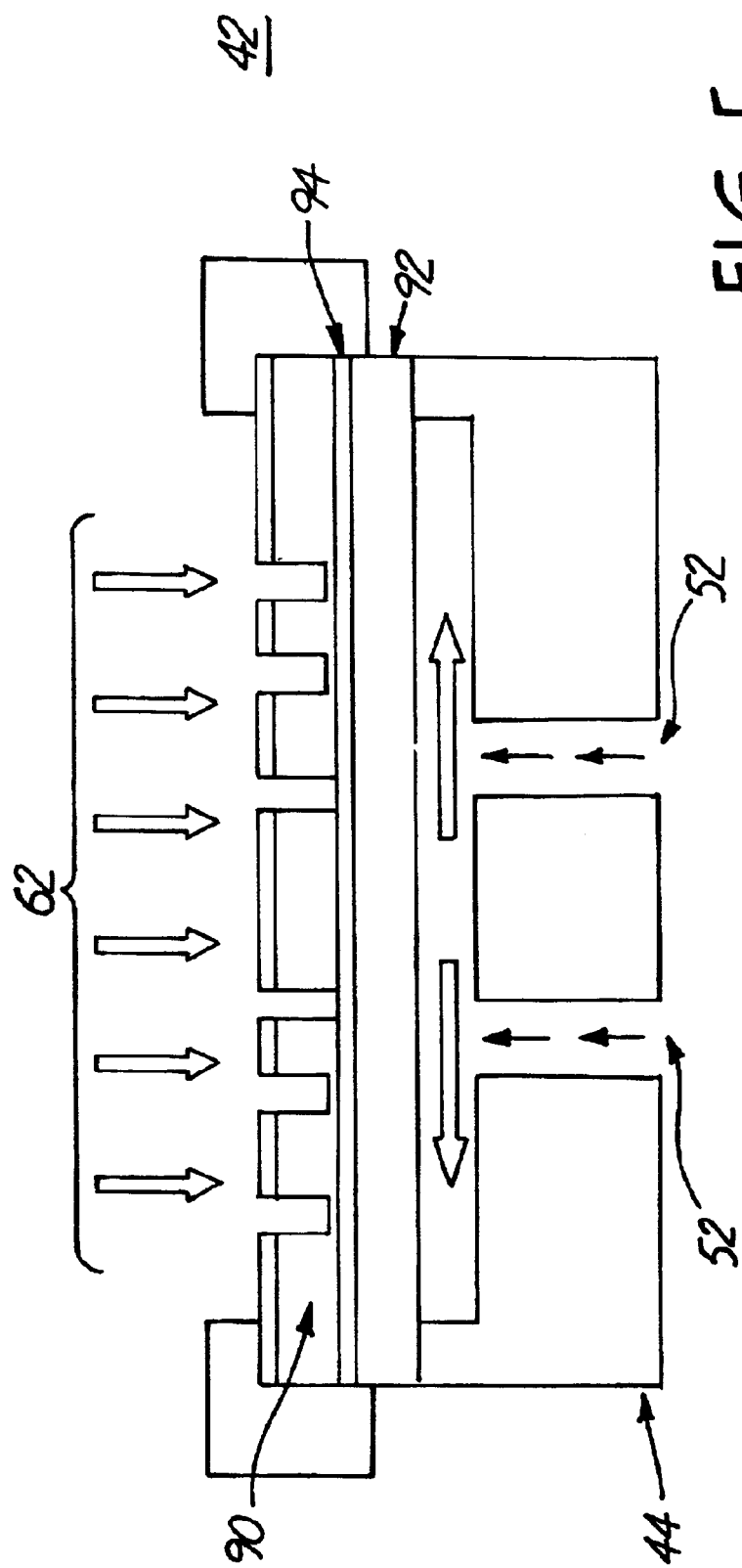
FIG. 5 is a cross-section view of a typical plasma etch chamber with helium backside cooling before through-wafer etch of a product wafer handled using a second prior art method (blank handle wafer method).
Figure 6:
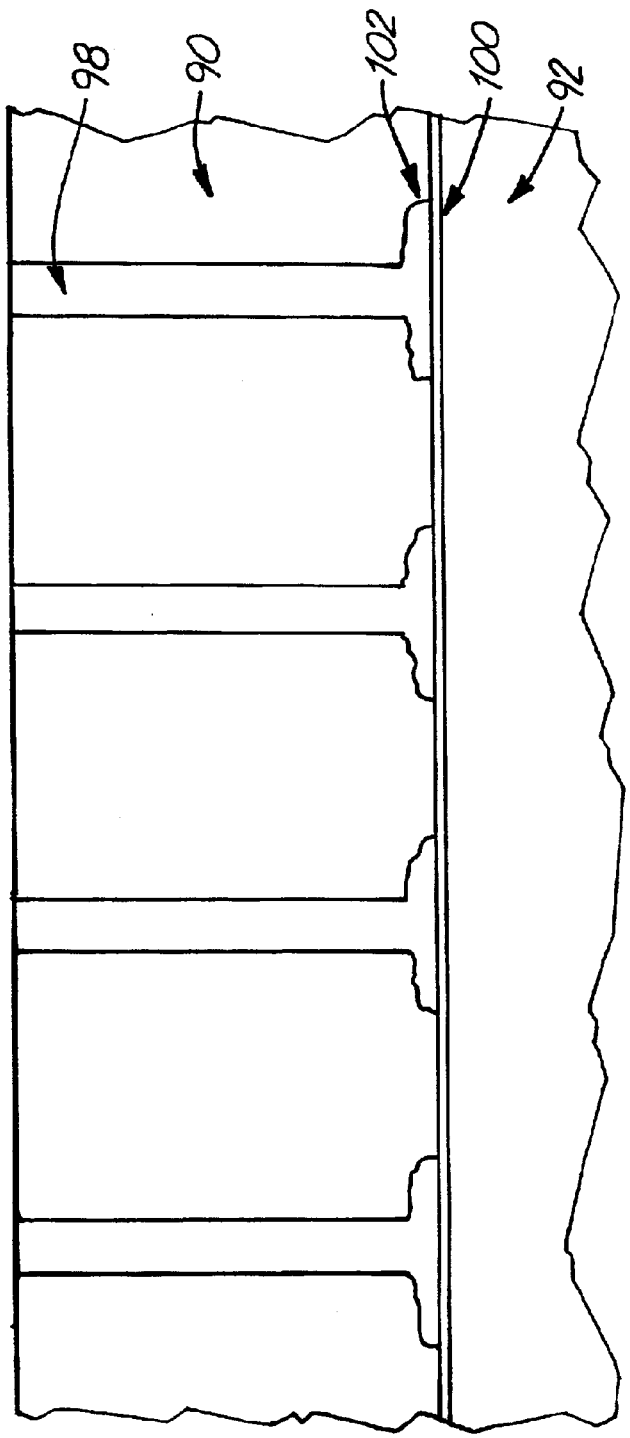
FIG. 6 is a magnified cross-section view of a narrow trench that is deep-trench reactive-ion etched down to a buried oxide insulating layer ("footing effect").

In order to fully understand the significance of the present invention, several figures disclosing the context and prior art of the present invention are first introduced. FIG. 1 presents a microactuator, a MEMS device with components typically formed using through-wafer plasma etching. FIG. 2 shows a typical plasma etch chamber used for through-wafer etching. FIGS. 3 and 4 disclose a first prior art method of handling a product wafer during through-wafer plasma etching. FIGS. 5 and 6 present a second prior art method of handling a product wafer during through-wafer plasma etching. The remaining figures, FIGS. 7a, 7b, 7c, 8a, 8b, 8c, 8d, and 9–11, disclose a method of handling a product wafer during through-wafer plasma etching according to the present invention.

FIG. 1 is a perspective view of microactuator 20, an exemplary MEMS device. Microactuator 20 includes outer preloading bars 22 and 24 and inner alignment clips 25 and 26, with inner alignment clips 25 and 26 clamping against the sides of slider S at a frontal portion thereof. Flexible beam springs 27 and 28 extend between the proximal ends of preloading bars 22 and 24 and the distal ends of alignment clips 25 and 26. A tub 30 for holding a plurality of magnets M is formed in the substrate of microactuator 20. Outer preloading bars. 22 and 24, flexible beam springs 27 and 28, inner alignment clips 25 and 26, and tub 30 are high-resolution features of microactuator 20, and thus must be precisely formed. Typically, these features are formed using a reactive-ion through-etching process. A method for handling devices such as microactuator 20 during the etch process is provided by the present invention. For a further description of microactuator 20 and its parts, see U.S. Application Serial No. 09/315,006, filed May 19, 1999, for "Magnetic Microactuator" by P. Crane, W. Bonin, and B. Zhang.

FIG. 2 is a perspective view of typical anisotropic etching system 40. Anisotropic etching system 40 is used for plasma etching semiconductor wafers and comprises plasma etching chamber 42 containing centrally positioned cathode 44. To begin the etching process, the wafer to be etched (not shown, for clarity) is first coated with an etching mask, for example of photoresist, with the etching mask leaving free the regions of the wafer that are intended to be anisotropically etched. Next, the wafer is loaded into chamber 42 through slot 46 using robotic means and is centrally positioned over cathode 44 on clamps 48. The wafer is then immobilized by securing a clamp ring (not shown) over clamps 48. A wafer process for ion acceleration is then applied to cathode 44.

Subsequently, chemically reactive species and electrically-charged particles (ions) are generated in a reactor. For the plasma etch chamber of FIG. 2, the reactor is situated atop chamber cover 50 such that the positively-charged cations generated in the reactor are accelerated toward the silicon wafer by means of the electric prestress applied to cathode 44. The cations fall nearly vertically onto the wafer surface left free by the etching mask, and support the chemical reaction of the reactive plasma species with the silicon.

Because high etching rates can be achieved with the described method, a warming of the silicon substrate comes about by means of the strongly exothermic chemical reaction of fluorine radicals with silicon. At correspondingly high temperatures, the mask materials, e.g., photoresist, lose their resistance to the etching species. Therefore, it is necessary to assure sufficient cooling of the silicon substrates. This is accomplished with methods known in the art, e.g., the cooling of the rear side of the silicon substrate by means of a helium gas current through ports 52. For a complete description of the anisotropic etching method and apparatus heretofore described, see U.S. Pat. No. 5,501,893, entitled "Method of Anisotropically Etching Silicon" by Laerner et al.

FIG. 3 is a cross-section view of plasma etch chamber 42 with helium backside cooling through ports 52, showing a first prior art method of handling product wafer 60 during deep-trench reactive ion etching performed by accelerated ions 62. Prior to introducing product wafer 60 into plasma etch chamber 42, product Wafer 60 is first coated with an etching mask (not shown), for example of photoresist 64, with the etching mask leaving free the regions of the silicon substrate that are intended to be anisotropically etched. Product wafer 60 is then loaded via robotic means into chamber 42, centrally positioned over cathode 44, and secured on clamps 48, after which reactive-ion etching commences. All such plasma etches have some inherent nonuniformity (i.e., some areas of product wafer 60 etch faster than others). Because of this nonuniformity, some areas of product wafer 60 are permeated sooner than others, resulting in devices releasing from the wafer at different times. As trenches 66, defined by photoresist 60, begin to etch completely through product wafer 60, channels 68 are created. Channels 68 allow helium from ports 52 to leak from back side 70 of product wafer 60 to the front, etching side 72. This helium leakage causes undesirable localized and wafer-level etching effects due to variations in gas composition, plasma, and wafer cooling. For example, as the wafer is permeated, the area surrounding channels 68 cools differently than the rest of wafer 60. This is significant in that reactive-ion etching 62 is a very temperature dependent process in which the etch rate changes with even a slight change in temperature. Furthermore, the direct supply of helium cooling from ports 52 at channels 68 also creates a non-uniformity in the gas composition of reactive-ion etching. This also induces a nonuniform etch around channels 68.

FIG. 4 is a cross-section view of plasma etch chamber 42 after completion of through-wafer etching of product wafer 60, showing a first prior art method of handling released MEMS devices 80. When through-etching is completed on product wafer 60, etched MEMS devices 80 "release" from wafer 60 (i.e., any connections between devices 80 and wafer 60 are etched away, thus separating devices 80 from wafer 60). Devices 80 then simply drop onto cathode 44. This is problematic in that it is desired to have released, singulated MEMS devices 80 unloaded from the chamber along with product wafer 60, rather than failing on cathode 60 and subsequently being left behind in chamber 42 after wafer unloading.

FIG. 5 is a cross-section view of plasma etch chamber 42 with helium backside cooling through ports 52, showing a second prior art method of handling product wafer 90 during deep-trench reactive ion etching performed by accelerated ions 62. This method involves the use of unpatterned handle wafer 92 for handling released devices from product wafer 90, and has been proposed (see, e.g., Field et al. U.S. Pat. No. 5,882,532) as a solution to the problems associated with the handling of released MEMS devices according to the aforementioned first prior art method. Under this approach, unpatterned handle wafer 92 is bonded to the non-etch side of product wafer 90 using a temporary adhesion layer 94 (such as photoresist). This method is advantageous in that released devices from product wafer 90 are prevented from falling onto cathode 44 by the presence of handle wafer 92. However, this method also has drawbacks. One such drawback occurs when residue from adhesion layer 94 is left on the bonded silicon surface between product wafer 90 and handle wafer 92. This residue causes difficulties in releasing product wafer 90 following completion of the etch. Further, adhesion layer 94 in contact with the bottom side of product wafer 90 also changes the etching characteristics due to photoresist plasma decomposition. Potential problems that could result from such changes include variations in etch depth and nonuniformity in etch width.

When an insulating film (such as silicon dioxide) or a non-insulating film (such as a metal thin film) is used in place of photoresist to realize adhesion layer 94, an "etch stop" is created, wherein accelerated ions 62 stop at adhesion layer 94 between product wafer 90 and handle wafer 92. However, this alternative also has its shortcomings. For example, both insulating and non-insulating films require a "release step" to remove adhesion layer 94 from product wafer 90 following etching. This is often extremely undesirable or incompatible with MEMS devices.

FIG. 6 shows a second adverse effect of using insulating layer 100 as an etch stop for narrow trenches 98 during a deep-trench RIE process. "Footing" 102 is typically observed at the interface between insulating layer 100 and product wafer 90. This effect is the result of charged ions from the reactive-ion etch gas. becoming embedded in insulating layer 100. As the ions build up in insulating layer 100, a charge builds up. As etching ions flow through etch trenches 98 toward insulating layer 100, the charge in layer 100 repels the etch ions laterally. This results in a significant undercut (i.e., footing 102), a phenomenon that can potentially disable a MEMS device.

Figure 7A:
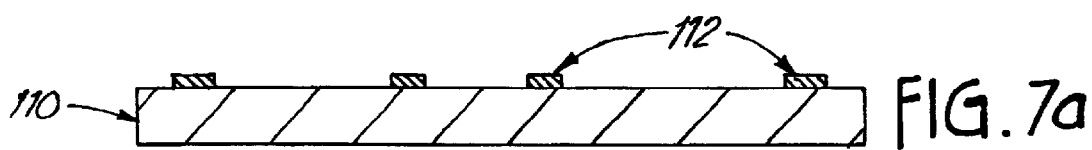
FIG. 7a is a cross-section view showing a blank handle wafer photopatterned with a photoresist mask in a selected mating structure pattern.
Figure 7B:
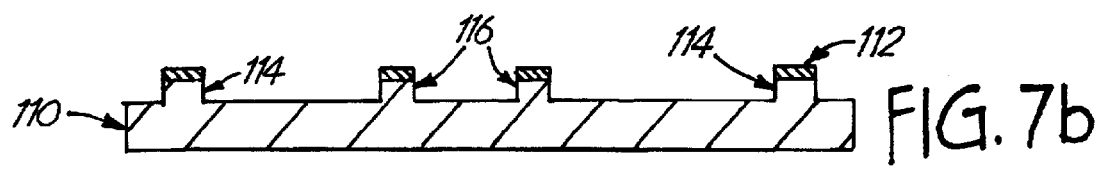
FIG. 7b is a cross-section view showing the handle wafer of FIG. 7a after plasma etching those areas not protected by photoresist.
Figure 7C:
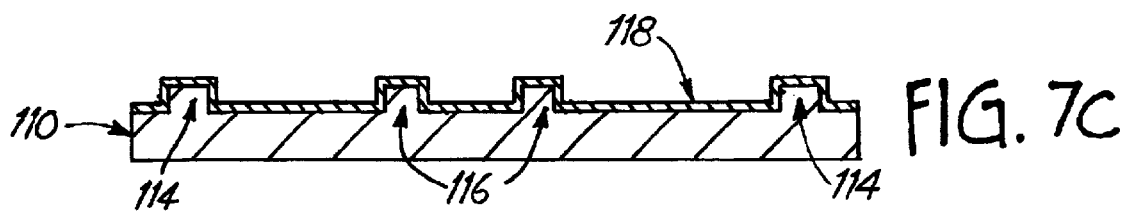
FIG. 7c is a cross-section view showing the handle wafer of FIG. 7b after the photoresist has been removed and an optional insulating layer has been added.

FIGS. 7a, 7b, and 7c show a cross-section view of steps for fabricating mating structures on handle wafer 110 according to the present invention. FIG. 7a is a cross-section view showing blank handle wafer 110 photopatterned with photoresist 112 in a selected pattern. The shape of the pattern is selectable from the various shapes etchable using reactive-ion etching (e.g. posts, notches, channels, etc.). In an exemplary embodiment, shown in FIG. 7b, ring 114 is etched near the edge of handle wafer 110 and thermal posts 116 are etched near the center of handle wafer 110. After the etch of the selected pattern is completed, photoresist 112 is stripped off, and insulating layer 118 may be deposited on handle wafer 110, as shown in FIG. 7c. Adding optional insulating layer 118 to handle wafer 110 maximizes the number of process wafer through-etches that can be performed with a single handle wafer because insulating layer 118 is resistant to the plasma etch process. FIGS. 8a, 8b, 8c, and 8d show a cross-section view of steps for fabricating mating structures on product wafer 120 according to the present invention. FIG. 8a is a cross-section view showing product wafer 120 photopatterned with photoresist 122 on side 124 (opposite side 125, where MEMS devices will be fabricated) in a selected pattern. The pattern must be selected such that the structures fabricated on handle wafer 110 (FIGS. 7a–7c) mate with those to be fabricated on product wafer 120. In other words, the structures must mesh with one another such that lateral movement between handle wafer 110 (FIGS. 7a–7c) and product wafer 120 is limited. The selected pattern is then reactive-ion etched onto side 124 of product wafer 120. In an exemplary embodiment, shown in FIG. 8b, the etching results in fabrication of ring 128 and posts 130. Next, photoresist 122 is stripped off, the results of which are shown in FIG. 8c. FIG. 8d shows the final step in preparation of product wafer 120 for through-wafer plasma etch. Product wafer 120 is inverted, and photoresist 134 is patterned on side 125 of product wafer 120 to define the features of the MEMS devices to be formed. The etching mask leaves free the regions of product wafer 120 that are intended to be through-wafer etched.

Figure 9:
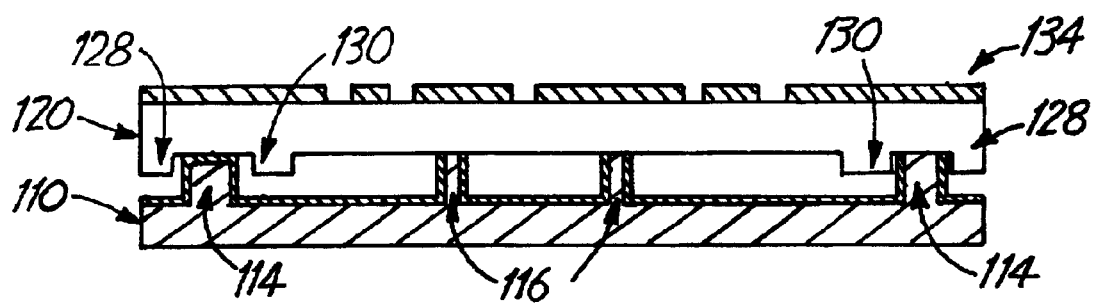
FIG. 9 is a cross-section view showing the handle wafer of FIG. 7c and the product wafer of FIG. 8d placed together.

FIG. 9 is a cross-section view showing the connection of the mating structures of handle wafer 110 of FIG. 7c and product wafer 120 of FIG. 8d when placed together. Note that in this exemplary embodiment ring 128 and posts 130 of product wafer 120 mate with ring 114 of handle wafer 110, thus limiting lateral movement during the through-etch process. This connection need not be a tight fit because there is minimal lateral force on the mated wafers during processing.

Moreover, some lateral shifting of product wafer 120 and handle wafer 110 with respect to one another is acceptable in most handling systems.

Figure 10:
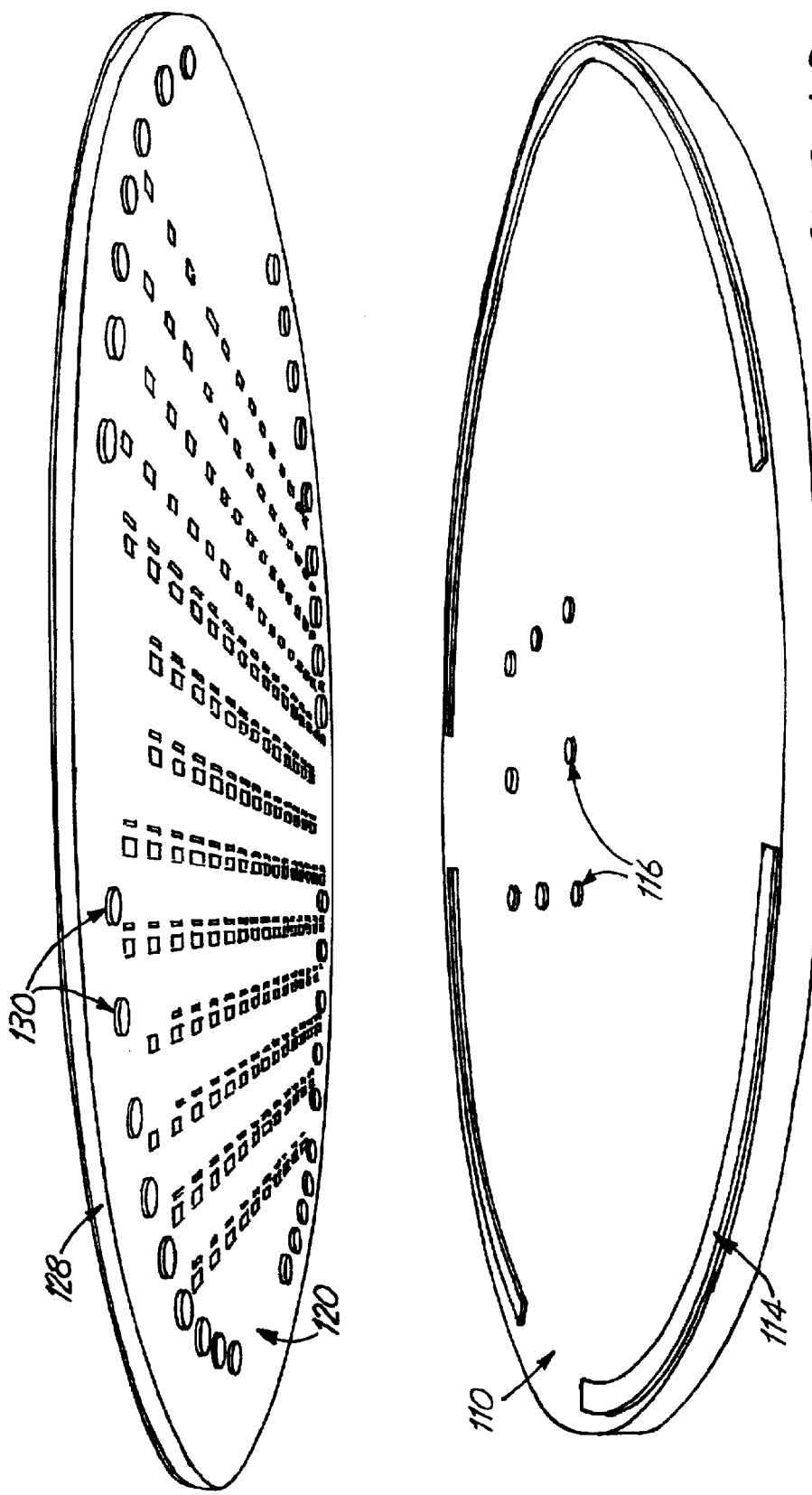
FIG. 10 is an exploded perspective view of FIG. 9, showing an example of functional lateral support between a product wafer and a handle wafer according to the present method.

FIG. 10 is an exploded perspective view, showing handle wafer 110 and product wafer 120 after fabrication of their respective mating structures. To limit lateral movement between product wafer 120 with handle wafer 110 during through-wafer plasma etching, ring 114 of handle wafer 110 is placed between support ring 128 and support posts 130 of product wafer 120. As described above, this connection need not be a tight fit.

Thermal contact posts 116 provide a further connection between handle wafer 110 and product wafer 120, and transfer helium cooling from the back side of handle wafer 110 to product wafer 120. This is important because at high temperatures, the mask materials, e.g., photoresist, lose their resistance to the etching species. Therefore, it is desirable to assure sufficient cooling of product wafer 120. Additionally, the number of thermal contact posts 116 can be increased to maximize the thermal contact area between wafers.

Figure 11:
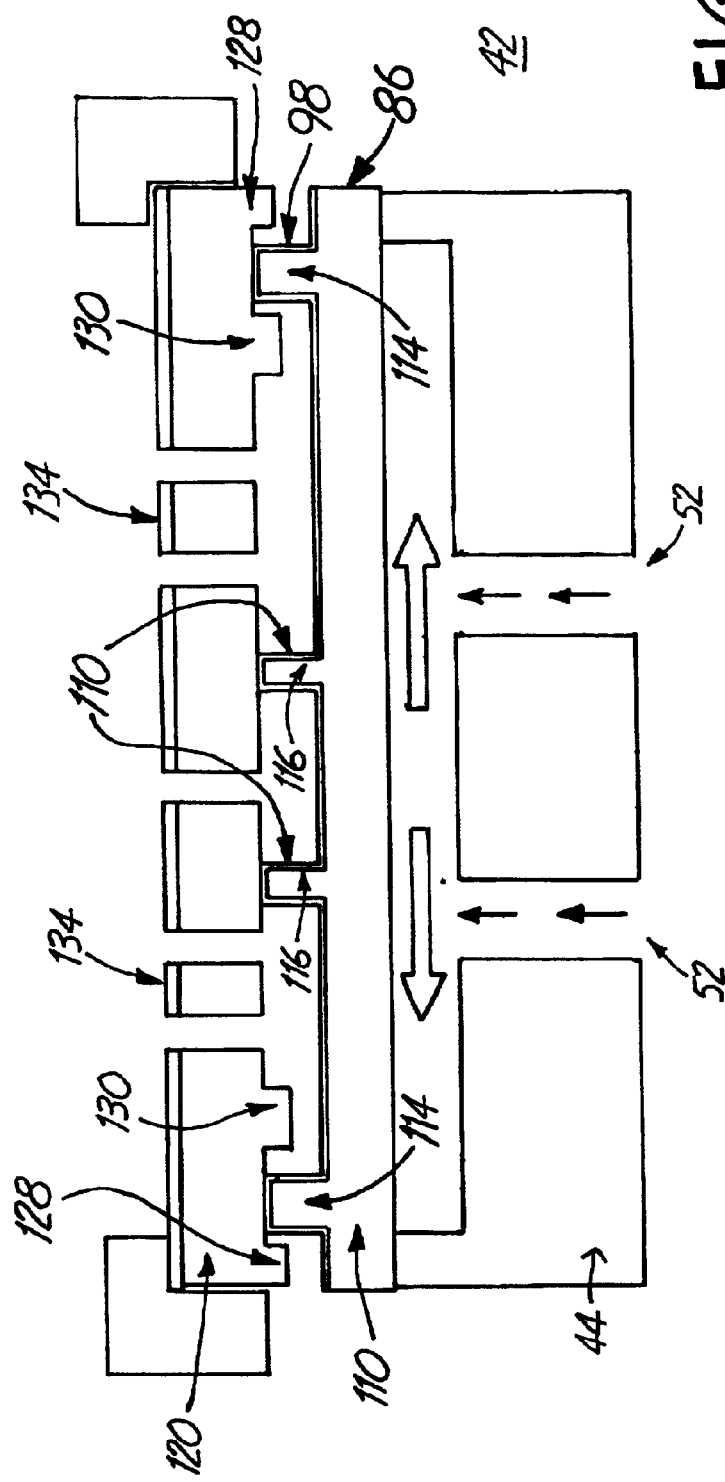
FIG. 11 is a cross-section view of a plasma etch chamber with helium backside cooling showing an example of functional lateral support between a product wafer and a handle wafer according to the present method.

FIG. 11 is a cross-section view of plasma etch chamber 42 with helium backside cooling through ports 52 of cathode 44, showing product wafer 120 placed on handle wafer 110 such that ring 128 and posts 130 of product wafer 120 and ring 114 of handle wafer 110 mesh together to limit lateral shifting between the two wafers. The two wafers are meshed with one another prior to introduction to plasma etch chamber 42. Once situated, the handle-product wafer combination is then loaded into plasma chamber 42 using robotic loading and centrally positioned upon cathode 44 such that the unetched side of handle wafer 110 rests upon cathode 44 and the side of product wafer 120 to be etched faces the top of plasma etch chamber 42. Through-wafer plasma etching then commences. As through-wafer etching proceeds, helium cooling from ports 52 remains on the back side of handle wafer 110, which transfers the cooling from handle wafer 110 to product wafer 120 by thermal conduction through thermal contact posts 116. In addition, as singulated parts 134 are released from product wafer 120, they are supported by handle wafer 110 and are thus unloaded with the mated product wafer 120 and handle wafer 110 upon completion of through-etching.

Because no photoresist or adhesives are used between handle wafer 110 and product wafer 120, no residual material remains on etched devices and separation of the two wafers is purely mechanical. Moreover, further processing can be conducted without rebonding or cleaning since there is no adhesion/bonding layer involved. Finally, if optional insulating layer 118, which is resistant to plasma etching, is deposited on handle wafer 110, the number of product wafer through-etches that can be performed with a single handle wafer can be maximized.

The present invention provides a method by which substrates that undergo a through-etch micromachining process are handled in a novel fashion. Through-etch processing is often difficult due to complications, such as etch nonuniformity and loss of anisotropic etch behaviors, that are related to back side cooling of the wafer and devices releasing from the wafer. To remedy this, the present method provides lateral support between a handle wafer and a product wafer using mating mechanical structures, rather than adhering an unpatterned handle wafer to the non-etch side of a product wafer as suggested by prior art. The advantages of using a non-adhesive connection are twofold: (1) a wafer can be etched, inspected, and subsequently etched again without the hindrance of repeated bonding, separation, and cleaning; and (2) the product wafer and devices easily separate from the handle wafer following etching without stripping or cleaning. After the devices have been separated from the product wafer, the handle wafer provides support for the removed devices, preventing them from falling onto the cathode in the plasma etch chamber. Furthermore, the handle wafers not only are reusable for multiple etch processes, but also enable backside helium cooling with a direct thermally conductive cooling path from the handle wafer to the product wafer through support posts.

Although the present invention has been described with reference to preferred embodiments, workers skilled in the art will recognize that changes may be made in form and detail without departing from the spirit and scope of the invention.

We claim:

1. A method of supporting a product wafer for etching of microelectromechanical system (MEMS) devices through a first side of the product wafer utilizing a patterned handle wafer, the method comprising:

forming a first structure pattern on a first side of the handle wafer;

forming a second structure pattern on a second side of the product wafer;

patterning a plurality of MEMS devices on the first side of the product wafer; and positioning the product wafer on the handle wafer with the second side of the product wafer facing the first side of the handle wafer wherein the first structure pattern of the handle wafer mates with the second structure pattern of the product wafer in a mechanical connection that limits lateral movement between the product wafer and the handle wafer; and etching the plurality of MEMS devices patterned on the product wafer using a through-etching process such that the MEMS devices are released from the product wafer.

2. The method of claim 1, further comprising:

coating the first side of the handle wafer with an insulating layer after formation of the first structure pattern on the handle wafer.

3. The method of claim 1, further comprising:

forming thermal contact structures on the first side of the handle wafer which provide a thermally conductive cooling path from the handle wafer to the product wafer.

4. The method of claim 3, wherein a number of thermal contact structures is selected to provide a predetermined thermal contact area between the handle wafer and the product wafer.

5. The method of claim 1, wherein the MEMS devices are disc drive microactuators.

6. A method of forming MEMS devices on a first side of a product wafer utilizing a handle wafer for supporting the product wafer, the method comprising:

forming a first structure pattern on a first side of the handle wafer;

forming a second structure pattern on a second side of the product wafer;

patterning a plurality of MEMS devices on the first side of the product wafer;

positioning the product wafer on the handle wafer with the second side of the product wafer facing the first side of the handle wafer wherein the first structure pattern of the handle wafer mates with the second structure pattern of the product wafer in a mechanical connection that limits lateral movement between the product wafer and the handle wafer;

placing the mated product wafer and handle wafer in a plasma etch chamber on a cathode such that a second side of the handle wafer contacts the cathode;

etching the plurality of MEMS devices patterned on the product wafer using a through-etching process; and removing the mated product wafer and handle wafer from the plasma etch chamber such that the product wafer, handle wafer, and released MEMS devices are removed together.

7. The method of claim 6, wherein etching the MEMS devices on the product wafer releases the MEMS devices from the product wafer onto the first side of the handle wafer.

8. The method of claim 6, further comprising:

coating the first side of the handle wafer with an insulating layer after formation of the first structure pattern on the handle wafer.

9. The method of claim 6, further comprising:

forming thermal contact structures on the first side of the handle wafer which provide a direct thermally conductive cooling path from the handle wafer to the product wafer.

10. The method of claim 9, wherein a number of thermal contact structures is selected to provide a predetermined thermal contact area between the handle wafer and the product wafer.

11. The method of claim 6, wherein the MEMS devices are disc drive microactuators.

12. An apparatus from which at least one MEMS device is formed by through-wafer plasma etching, the apparatus comprising:

a handle wafer having a first side with a first structure pattern;

a product wafer having a first side with a MEMS device feature pattern and a second side with a second structure pattern; and wherein the product wafer and the handle wafer are positioned with the second side of the product wafer facing the first side of the handle wafer, the first structure pattern of the handle wafer mating with the second structure pattern of the product wafer in a mechanical connection that limits lateral movement between the product wafer and the handle wafer.

13. The apparatus of claim 12, further including:

an insulating layer on the first side of the handle wafer.

14. The apparatus of claim 12, further including:

a direct thermally conductive cooling path from the handle wafer to the product wafer that is provided by thermal contact structures on the first side of the handle wafer.

15. The apparatus of claim 14, wherein a number of thermal contact structures is selected to provide a predetermined thermal contact area between the handle wafer and the product wafer.

16. The apparatus of claim 12, wherein at least one MEMS device is a disc drive microactuator.

* * * * *

UNITED STATES PATENT AND TRADEMARK OFFICE
CERTIFICATE OF CORRECTION

PATENT NO. : 6,733,681 B1
DATED : May 11, 2004
INVENTOR(S) : Roger L. Hipwell Jr. et al.

It is certified that error appears in the above-identified patent and that said Letters Patent is hereby corrected as shown below:

Column 4,
Line 27, delete "Laerner", insert -- Laermer --
Line 33, delete "Wafer", insert -- wafer --

Column 5,
Line 4, delete "failing", insert -- falling --
Line 57, delete "photopattermed", insert -- photopatterned --

Column 7,
Line 42, delete "backside", insert -- back side --

Signed and Sealed this

Fourteenth Day of December, 2004

JON W. DUDAS
*Director of the United States Patent and Trademark Office*